United States Patent
Roland et al.

(10) Patent No.: US 11,003,200 B1
(45) Date of Patent: May 11, 2021

(54) CLOSED LOOP JUNCTION TEMPERATURE REGULATION

(71) Applicant: Cirrus Logic International Semiconductor Ltd., Edinburgh (GB)

(72) Inventors: Rodney Roland, Dale, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/893,818

(22) Filed: Jun. 5, 2020

(51) Int. Cl.
*G05F 1/46* (2006.01)
*G01K 7/01* (2006.01)
*G01R 19/25* (2006.01)

(52) U.S. Cl.
CPC ............ *G05F 1/463* (2013.01); *G01K 7/01* (2013.01); *G01R 19/2503* (2013.01)

(58) Field of Classification Search
None
See application file for complete search history.

(56) References Cited

U.S. PATENT DOCUMENTS

| 7,648,270 B2* | 1/2010 | Faour ............... G01K 7/01 374/178 |
| 7,878,016 B2 | 2/2011 | Rotem et al. |
| 8,350,552 B1* | 1/2013 | Marten ............... G01K 7/01 323/297 |
| 2016/0349118 A1 | 12/2016 | Olson et al. |

OTHER PUBLICATIONS

Ardizzoni, John "ESD Diode Doubles as Temperature Sensor." AnalogDialogue, vol. 41, Nov. 2007. Downloaded from https://www.analog.com/en/analog-dialogue/articles/esd-diode-doubles-as-temperature-sensor.html.
Intel® Pentium® III Processor Thermal Design Guide Application Note, Dec. 2001. Section 3.1 Thermal Diode, p. 7. http://download.intel.com/design/intarch/applnots/27332504.pdf.
Ahuja, Ashish "Automated Temperature Characterization for Packaged Integrated Circuits Using On-Chip Electrostatic Discharge Structures." May 2009 Abstract. p. 1. Downloaded Feb. 27, 2020 at https://ttu-ir.tdl.org/handle/2346/59242.

* cited by examiner

*Primary Examiner* — Jeffery S Zweizig
(74) *Attorney, Agent, or Firm* — E. Alan Davis; James W. Huffman

(57) ABSTRACT

An apparatus measures a junction temperature in an IC through a pin of the IC and concurrently provides a digital input signal to digital logic of the IC through the pin. The IC has an ESD diode structure connected to the pin. High and low side voltage sensors sense a voltage drop across the diode structure. An input multiplexer controlled by the digital input signal selectively connects high and low side current sources to the pin to concurrently provide the digital input signal to the digital logic and to drive a constant current through the diode structure. An output multiplexer controlled by the digital input signal selectively connects the high and low side voltage sensors to an output that provides a sense signal indicative of the IC junction temperature.

20 Claims, 3 Drawing Sheets

CLOSED LOOP JUNCTION TEMPERATURE REGULATION

BACKGROUND

As integrated circuits become smaller and more powerful, heat is generated very quickly and very locally. Having observability and control over the temperature inside the active circuitry has become a major challenge. Temperature has a profound impact on performance of the devices within the integrated circuit. As such, it is important to have accurate visibility and control over the temperature of the devices. This temperature visibility and control may be particularly true when testing the integrated circuit, for example. In some sense, the value of the data obtained during testing of the integrated circuit is affected by the ability to control the temperature of the integrated circuit.

Historically, device temperature has been monitored and regulated through a remote thermocouple probe. The thermocouple is glued or pressed onto the body of the integrated circuit being tested. The thermal control system includes a remote temperature sensor input that receives the temperature of the probe. The user typically has an option to regulate to the remote sensor. This method has limitations. First, the temperature is only as accurate as the proximity of the probe. Second, it is difficult to move the physical probe from one device to the next.

SUMMARY

In one embodiment, the present disclosure provides an apparatus for measuring a junction temperature in an integrated circuit (IC) through a pin of the IC concurrently with providing a digital input signal to digital logic of the IC through the pin, the IC also having an electrostatic discharge (ESD) diode structure connected to the pin. The apparatus includes high and low side current sources, high and low side voltage sensors that sense a voltage drop across the diode structure, an input multiplexer controlled by the digital input signal to selectively connect the high and low side current sources to the pin to concurrently provide the digital input signal to the digital logic and to drive a constant current through the diode structure, and an output multiplexer controlled by the digital input signal to selectively connect the high and low side voltage sensors to an output that provides a sense signal that is indicative of the junction temperature in the IC.

In another embodiment, the present disclosure provides a method that includes, using a pin of an IC to provide a digital input signal to digital logic of the IC and to concurrently drive a constant current through an ESD diode structure of the IC. The diode structure is connected to the pin. The method also includes concurrently using the pin and the diode structure to sense a junction temperature in the IC.

In yet another embodiment, the present disclosure provides a method that includes, during first time intervals, pulling current out of a digital function pin of an IC and measuring a temperature of the IC. The method also includes, during second time intervals exclusive of the first time intervals, pushing current into the pin and measuring the temperature of the IC. The measuring of the temperature is performed by measuring a voltage on the pin. The pushing and pulling of the current and the measuring of the temperature are performed during a test of the IC.

DETAILED DESCRIPTION

Embodiments are described that employ diodes inside the integrated circuit to continuously sense the temperature inside the integrated circuit while it is being tested in order to regulate the temperature of the integrated circuit during the test. Electrically isolated measurement circuitry allows forcing current through the diodes and measuring their forward voltage under dynamic, non-fixed, or no power supply conditions. Multiplexed dual measurement circuitry allows dynamic switching between high side and low side diodes, which allows for concurrent digital communication with the integrated circuit and temperature measurement of the integrated circuit on a single pin of the integrated circuit.

More specifically, a digital control signal used to test the integrated circuit is caused to reach digital logic of the integrated circuit while the temperature is being sensed from one of the two diodes, or more specifically, while sensing a forward voltage across the diodes from which the diode junction temperature may be reliably determined. In order to combine the two functions on a single connection concurrently, e.g., the single pin, the digital control signal is sent as a control signal of a first multiplexer. The first multiplexer sends the signal from a high side or a low side current source through the pin to the digital logic. The temperature sensing is performed through the pin with corresponding high side and low side voltage sensing analog-to-digital converters which are connected through an electrical isolator to a second multiplexer. The current sources and the voltage sensors are floating, i.e., they are not ground referenced. The electrical isolator allows the voltage sensors to sense the voltage drop across the temperature sensing diodes without causing or receiving interference from the system power supply, i.e., the power supply that supplies power to the integrated circuit. The second multiplexer selects the appropriate sensing location and sends the selected sensed voltage to a temperature control/datalogging system that uses the sensed voltage, which is indicative of the diode junction temperature, to regulate the temperature of the integrated circuit. Advantageously, the pin and diodes may be a pin and diodes that already exist on the integrated circuit, e.g., a reset pin or other digital function pin and electro-static discharge diodes connected to the pin, and the pin may continue to be used to provide the digital input signal during testing even while the pin is also used to measure the temperature. The voltage sensors are in a floating power domain isolated from the power domain of the integrated circuit and are duplicated for the high side and the low side such that either diode may be used, which enables the pin to continue to be used as a digital input during the temperature measurement.

Figure 1:
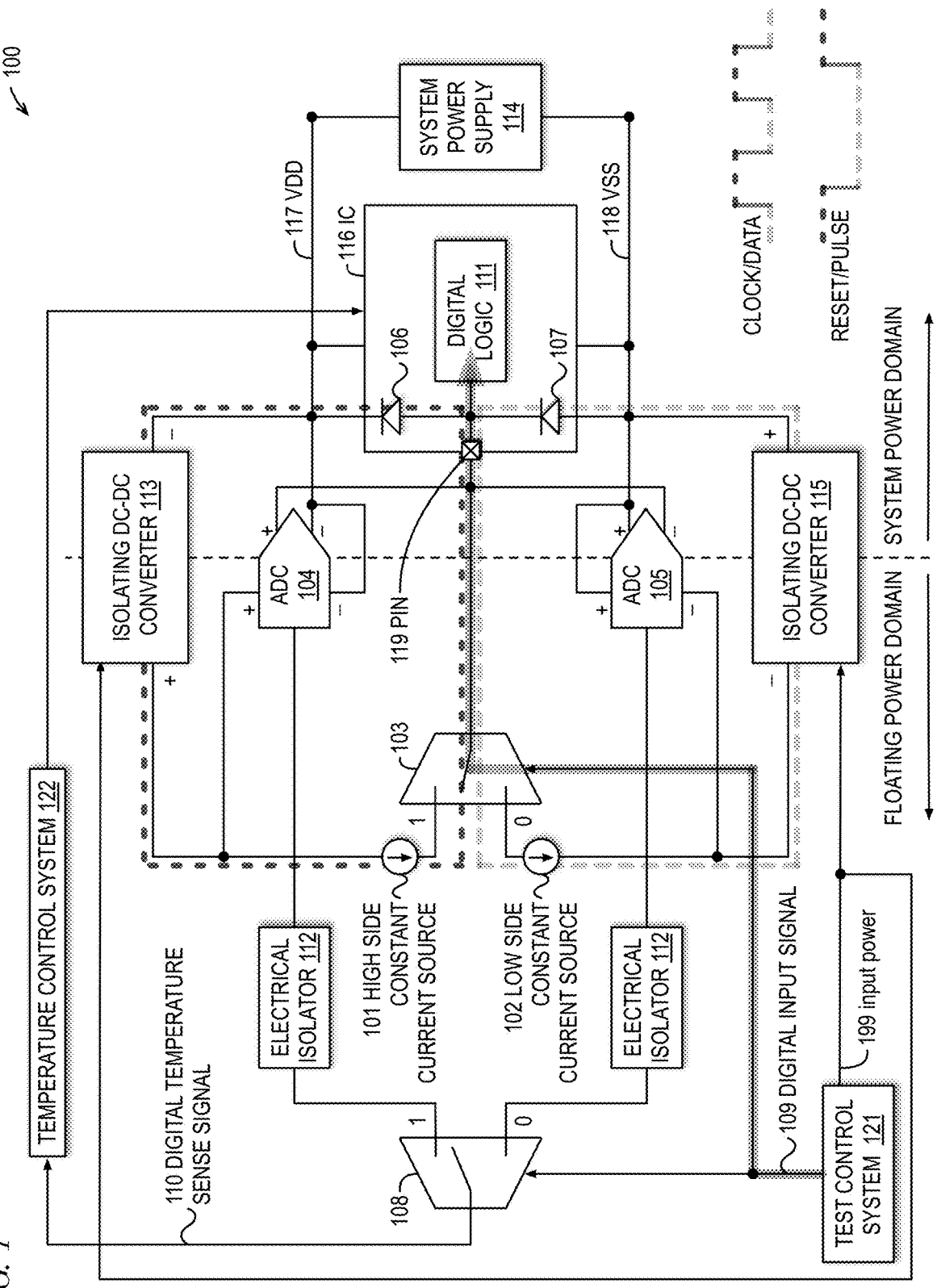
FIG. 1 is an example block diagram of a system in which closed loop junction temperature regulation is performed in accordance with embodiments of the present disclosure.

FIG. 1 is an example block diagram of a system 100 in which closed loop junction temperature regulation is performed in accordance with embodiments of the present disclosure. The system 100 includes an integrated circuit (IC) 116 that is the device under test (DUT) and a system power supply 114 that supplies power to the IC 116. In one embodiment, the power supply 114 provides VDD 117 and VSS 118 power rails to the IC 116. In one embodiment, the system power supply 114 that supplies power to the IC 116 is a variable power supply controlled by the test control system 121 in order to test the IC 116 at different supply voltages.

The IC 116 includes digital logic 111, e.g., digital filters, programmable logic, memory, audio processing circuitry, haptic sensor circuitry, amplifiers, digital signal processing circuitry, among others. The IC 116 may also include non-digital circuitry, e.g., as analog filters and amplifiers, among others. Together, the IC 116 and power supply 114 are included in a system under test (SUT) by a test control system 121.

The test control system 121 provides a digital input signal 109 that is used to test the IC 116. The digital input signal 109 may be, for example, a digital reset signal, a digital clock signal, a digital control signal, or a digital data signal. The test control system 121 may provide other test input to the IC 116, e.g., test vectors, during testing. The test control system 121 observes the outputs produced by the IC 116 in response to the digital input signal 109 and the other test input. The IC 116 also includes a pin 119 that is connected to the digital logic 111 and that enables the IC 116 to be connected to circuitry outside the IC 116.

The IC 116 also includes an electrostatic discharge (ESD) diode structure connected to the pin 119. In the embodiment of FIG. 1, a high side diode 106 has its cathode connected to VDD 117 and its anode connected to the pin 119, and a low side diode 107 has its anode connected to VSS 118 and its cathode connected to the pin 119. As described in more detail below, the diodes 106 and 107 are used to measure a junction temperature of the IC 116 by selectively pushing and pulling a constant current through them, respectively, and sensing the voltage across. The diodes 106/107 act as thermal diodes in that, when presented with a constant current, their forward voltage varies with temperature in a predictable and well-known manner. In one embodiment, the diodes 106/107 are calibrated to increase the accuracy of their use as a temperature measurement device.

The system 100 also includes a temperature control system 122 that regulates the temperature of the IC 116 while it is under test by the test control system 121. For example, the temperature control system 122 may include heating and cooling elements used to heat and cool the IC 116, e.g., to keep the IC 116 at a constant temperature while being tested by the test control system 121. The temperature control system 122 receives a digital temperature sense signal 110 that is indicative of the junction temperature of the IC 116, as described in more detail below. The temperature control system 122 may also include other circuitry for filtering (e.g., decimating) and scaling the digital temperature sense signal 110.

Thus, the system 100 is a closed loop in that it receives feedback, in the form of the digital temperature sense signal 110 that is used to regulate the temperature of IC 116 while under test. As described in more detail below, advantageously, the pin 119 is used to both provide the digital input signal 109 from the test control system 121 and to concurrently sense the temperature of the IC 116. The closed loop system that concurrently uses the pin 119 to test the IC 116 and measures its junction temperature may advantageously provide significant improvement in maintaining a relatively constant temperature of the IC 116 while under test compared with an open loop system that does not concurrently measure and control the junction temperature during testing. As described above, avoiding a substantial temperature change over the duration of the test may result in test data that is more useful than test data obtained during substantial temperature swings.

The system 100 also includes isolating DC-DC converters 113 and 115 (shown at upper and lower locations in FIG. 1) that receive input power 199 from the test control system 121. The upper isolating DC-DC converter 113 supplies floating positive and negative voltages to respective positive and negative supply inputs of a high side analog-to-digital converter (ADC) 104. The lower isolating DC-DC converter 115 supplies floating positive and negative voltages to respective positive and negative supply inputs of a low side ADC 105. The negative supply output of the upper isolating DC-DC converter 113 is also connected to VDD 117, and the positive supply output of the lower isolating DC-DC converter 115 is also connected to VSS 118. A positive sense input of the high side ADC 104 is connected to the pin 119, and a negative sense input of the high side ADC 104 is connected to VDD 117. A positive sense input of the low side ADC 105 is connected to VSS 118, and a negative sense input of the low side ADC 105 is connected to the pin 119. The isolating DC-DC converter 113/115 effectively provides a separation in the system 100 between a system power domain supplied by the system power supply 114 and a floating power domain supplied by the isolating DC-DC converter 113/115 that enables the ADCs 104/105 to sense the voltage drop across the diodes 106/107 without causing or receiving interference from the SUT, e.g., the IC 116 and the system power supply 114, as described in more detail below.

The floating positive supply voltage is also provided to a high side constant current source 101 that pushes a constant current into a first input of an input multiplexer 103, and the floating negative supply voltage is also provided to a low side constant current source 102 that pulls a constant current out of a second input of the input multiplexer 103. The output of the input multiplexer 103 is connected to the pin 119, the digital logic 111, the anode of the high side diode 106 and the cathode of the low side diode 107. The input multiplexer 103 is controlled by the digital input signal 109.

When the digital input signal 109 is high, the input multiplexer 103 disconnects the low side current source 102 and connects the high side current source 101 to the pin 119 such that the constant current is pushed through the high side diode 106 and the resulting voltage drop across the diode 106 is sensed by the high side ADC 104 and provided to a high side electrical isolator 112, and a high value is provided to the digital logic 111. This electrical flow is shown pictorially in FIG. 1 by the darker dashed path from the high side current source 101 through the input multiplexer 103 through the high side diode 106 to the upper isolating power converter 113 and back to the high side current source 101. The electrical isolator 112 may be any device that provides electrical isolation such that the ADC 104 is enabled to sense the voltage drop across the diode 106 without causing or receiving interference from the SUT. Examples of the electrical isolator 112 may include a transformer, an opto-coupling (e.g., opto-isolated ADC, such as may be used in motor controls), and an ethernet port with a small transformer, among others. In one embodiment, the ADCs 104/105 are zero-centered, and a bandgap regulator is connected to the negative pin of the high side ADC 104 and to the positive pin of the low side ADC 105 to provide a DC offset (e.g., 0.6V) in order to maximize resolution of the sensed voltage measurements.

When the digital input signal 109 is low, the input multiplexer 103 disconnects the high side current source 101 and connects the low side current source 102 to the pin 119 such that the constant current is pulled through the low side diode 107 and the resulting voltage drop across the diode 107 is sensed by the low side ADC 105 and provided to a low side electrical isolator 112, and a low value is provided to the digital logic 111. This electrical flow is shown pictorially in FIG. 1 by the lighter dashed path from the low side current source 102 through the input multiplexer 103 through the low side diode 107 to the lower isolating power converter 115 and back to the low side current source 102. Thus, the ADCs 104/105 essentially operate in both the system power domain and the floating power domain in that they receive power in the floating power domain from the isolating DC-DC converter 113/115 and they sense the voltage across the diodes 106/107 that receive power in the system power domain from the system power supply 114. Thus, the isolating DC-DC converter 113/115 enables the ADCs 104/105 to sense the voltage drop across the diodes 106/107 without causing or receiving interference from the SUT, which may provide for a more accurate continuous measurement of the junction temperature of the IC 116 while being tested for use by the temperature control system 122 to regulate the temperature of the IC 116 while being tested.

An output multiplexer 108, controlled by the digital input signal 109, receives the outputs of the electrical isolators 112. The output multiplexer 108 selects the high side electrically isolated sensed voltage when the digital input signal 109 is high and selects the low side electrically isolated sensed voltage when the digital input signal 109 is low. The selected signal is provided as the digital temperature sense signal 110 to the temperature control system 122.

In this manner, i.e., by the digital input signal 109 controlling the input multiplexer 103 and operation of the current sources 101/102, the digital input signal 109 is effectively conveyed to the digital logic 111 (e.g., during a test of the IC 116) via the pin 119 as part of the testing of the IC 116, i.e., the IC 116 responds to the digital input signal 109 (and other test inputs) to produce results that may be compared to expected results to test the performance of the devices of the IC 116. Concurrently with conveyance of the digital input signal 109 via the pin 119, the forward voltage of the diode structure 106/107, through which the constant current is driven, may be sensed through the pin 119, and the junction temperature of the diodes 106/107 may be determined from the locally sensed voltage. The concurrently measured junction temperature may be used to control the temperature of the IC 116 concurrently with the testing of the IC 116, which involves provision of the digital input signal 109 via the pin 119. Preferably, the junction temperatures are not measured during transitions of the digital input signal 109. That is, the output multiplexer 108 is being switched during a high-to-low or low-to-high transition of the digital input signal 109, and the sensed voltages are not observed during the transition times. However, not measuring the temperature during the transition times may be acceptable because the transition times are significantly small relative to the rate at which the temperature changes, and the temperature is still measured at a sufficient rate for the temperature control system 122 to use the measured temperature to regulate the temperature of the IC 116. In one embodiment, mux 108 may include a latch mechanism that may hold the temperature reading during a transition period in order to prevent the temperature control system 122 from receiving bad data while the ADCs 104/105 are settling in the wake of a transition.

Two examples of the provision of the digital input signal 109 to the digital logic 111 via the digital function pin 119 are shown as digital waveforms in the lower right-hand portion of FIG. 1. The top waveform illustrates a digital clock or digital data signal being conveyed to the digital logic 111 via pin 119, and the bottom waveform illustrates a reset pulse being conveyed to the digital logic 111 via pin 119. High values of the digital waveforms are shown with the darker dashed lines corresponding to the high side path similarly demarcated in the block diagram, whereas low values of the digital waveforms are shown with the lighter dashed lines corresponding to the low side path similarly demarcated in the block diagram.

Figure 2:
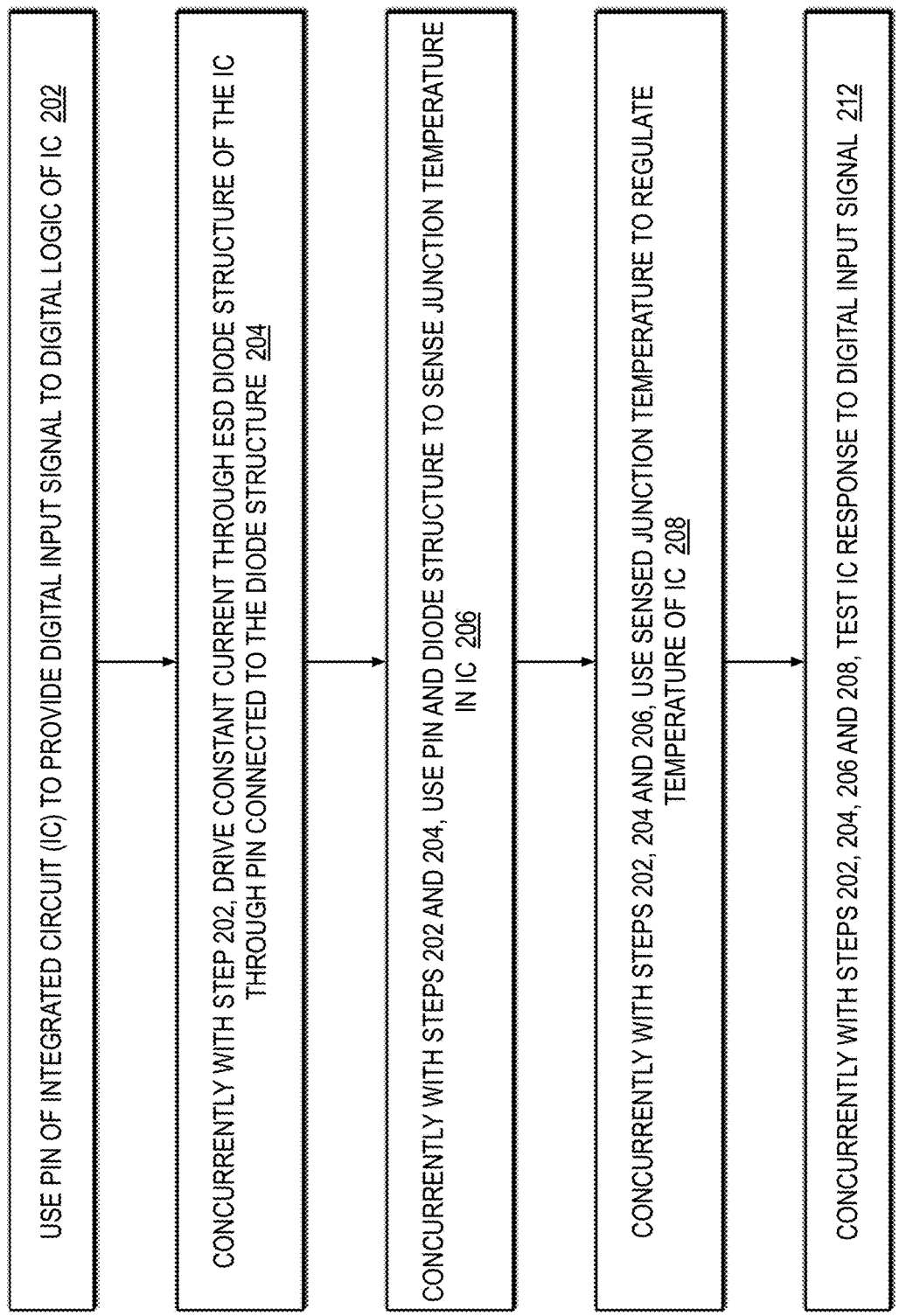
FIG. 2 is an example flowchart illustrating closed loop junction temperature regulation in accordance with embodiments of the present disclosure.

FIG. 2 is an example flowchart illustrating closed loop junction temperature regulation in accordance with embodiments of the present disclosure. Operation begins at block 202.

At block 202, a pin (e.g., pin 119) of an integrated circuit (e.g., IC 116) is used to provide a digital input signal (e.g., digital input signal 109) to digital logic (e.g., digital logic 111) of the IC. Operation proceeds to block 204.

At block 204, which is performed concurrently with operation of block 202, a constant current is driven through an ESD diode structure (e.g., through diodes 106/107 by constant current sources 101/102) through the pin, which is connected to the diode structure. Operation proceeds to block 206.

At block 206, which is performed concurrently with operation of blocks 202 and 204, the pin is used to sense a junction temperature of the diode structure, more specifically, to sense a forward voltage across the diode structure, which is related to the junction temperature in a known manner such that the junction temperature is determined from the sensed voltage. Operation proceeds to block 208.

At block 208, which is performed concurrently with operation of blocks 202, 204 and 206, the sensed junction temperature is used to regulate the temperature of the integrated circuit (e.g., by temperature control system 122). Operation proceeds to block 212.

At block 212, which is performed concurrently with operation of blocks 202, 204, 206 and 208, the response of the integrated circuit to the digital input signal (and typically other test inputs) is observed, i.e., the integrated circuit is tested (e.g., by test control system 121).

Figure 3:
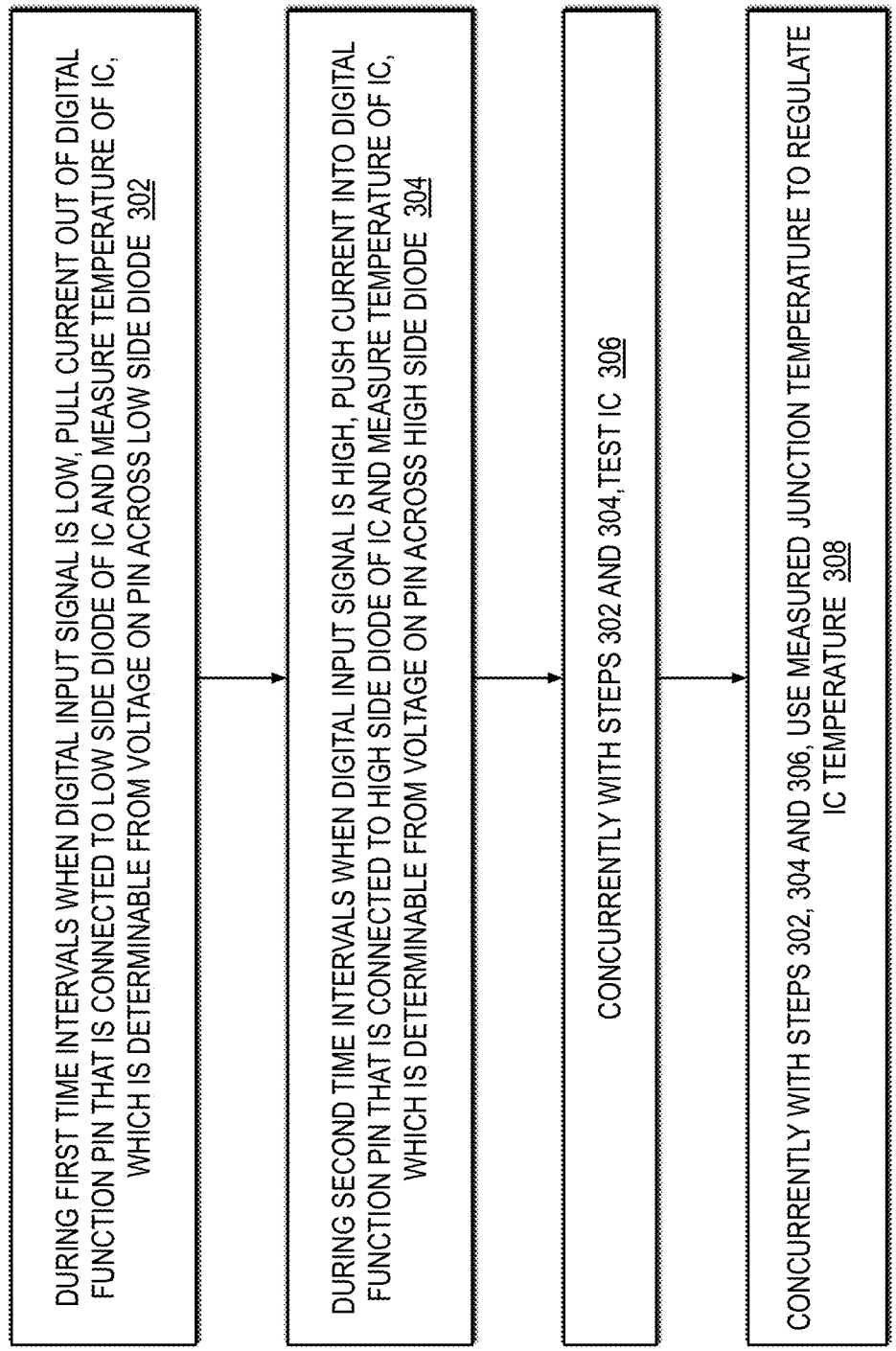
FIG. 3 is an example flowchart illustrating closed loop junction temperature regulation in accordance with embodiments of the present disclosure.

FIG. 3 is an example flowchart illustrating closed loop junction temperature regulation in accordance with embodiments of the present disclosure. Operation begins at block 302.

At block 302, during a first at least one time interval when a digital input signal (e.g., digital input signal 109) is low, current is pulled out of a digital function pin (e.g. pin 119) that is connected to a low side ESD diode (e.g., diode 107) of an integrated circuit (e.g., IC 116), and a junction temperature of the low side diode is measured. More specifically, the forward voltage induced on the low side diode is sensed and the temperature is computed based on the sensed voltage and the amount of current pulled through the low side diode. Operation proceeds to block 304.

At block 304, during a second at least one time interval when the digital input signal is high, current is pushed into the digital function pin that is also connected to a high side ESD diode (e.g., diode 106) of the integrated circuit, and a junction temperature of the high side diode is measured. More specifically, the forward voltage induced on the high side diode is sensed and the temperature is computed based on the sensed voltage and the amount of current pushed through the high side diode. Operation proceeds to block 306.

At block 306, which is performed concurrently with the operations at blocks 302 and 304, the integrated circuit is tested (e.g., by test control system 121). That is, inputs are sent to the integrated circuit, including the digital input signal, and the response of the integrated circuit is observed and compared with expected results to determine how the integrated circuit is performing, including individual devices therein. Operation proceeds to block 308.

At block 308, which is performed concurrently with the operations at blocks 302, 304 and 306, the measured junction temperature is used to regulate the temperature of the integrated circuit (e.g., by temperature control system 122).

As stated above, the electrically isolated measurement circuitry allows forcing current through the diodes and measuring their forward voltage under dynamic, non-fixed, or no power supply conditions. More specifically, by operation of the isolating DC-DC converter effectively providing a separation between the system power domain and the floating power domain that enables the ADCs to sense the voltage drop across the diodes without causing or receiving interference from the SUT, the measurement circuitry may operate even when the system power is turned off (although the digital logic inside the DUT will not function). This may be useful to attain a specific temperature prior to starting the test of the DUT when the DUT may be powered down or not present, and may also be useful to keep the temperature stable between tests when the DUT may be powered down or not in a functional state.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. An apparatus for measuring a junction temperature in an integrated circuit (IC) through a pin of the IC concurrently with providing a digital input signal to digital logic of the IC through the pin, the IC also having an electrostatic discharge (ESD) diode structure connected to the pin, comprising:
   high and low side current sources;
   high and low side voltage sensors that sense a voltage drop across the diode structure;
   an input multiplexer controlled by the digital input signal to selectively connect the high and low side current sources to the pin to concurrently provide the digital input signal to the digital logic and to drive a constant current through the diode structure; and
   an output multiplexer controlled by the digital input signal to selectively connect the high and low side voltage sensors to an output that provides a sense signal that is indicative of the junction temperature in the IC.

2. The apparatus of claim 1,
   wherein the voltage sensors comprise voltage sensing analog-to-digital converters (ADCs) and the sense signal is a digital signal.

3. The apparatus of claim 1, further comprising:
   an electrical isolation device, connected between the voltage sensors and the output multiplexer, wherein the electrical isolation device enables the voltage sensors to sense the voltage drop across the diode structure without causing or receiving interference from a system under test that includes the IC and a power supply that supplies power to the IC.

4. The apparatus of claim 3,
   wherein the power supply that supplies power to the IC is a variable power supply.

5. The apparatus of claim 1, further comprising:
   an isolation device, connected between the apparatus and a system under test that includes the IC and a power supply that supplies power to the IC, that uses power from the IC power supply to provide power to the high and low side current sources and the high and low side voltage sensors; and
   wherein the isolation device enables the voltage sensors to sense the voltage drop across the diode structure without causing or receiving interference from the system under test.

6. The apparatus of claim 1,
   wherein the apparatus is configured for connection with a test system that generates the digital input signal; and
   wherein the current sources, the voltage sensors and the multiplexers provide for electrical isolation between the test system and a system under test that includes the IC and a power supply that supplies power to the IC.

7. The apparatus of claim 1,
wherein the apparatus is configured for connection with a control system that uses the sense signal to regulate the IC junction temperature; and
wherein the current sources, the voltage sensors and the multiplexers provide for electrical isolation between the control system and a system under test that includes the IC and a power supply that supplies power to the IC.

8. The apparatus of claim 1,
wherein the apparatus and the control system provide a closed loop regulation system.

9. A method, comprising:
using a pin of an integrated circuit (IC) to provide a digital input signal to digital logic of the IC and to concurrently drive a constant current through an electrostatic discharge (ESD) diode structure of the IC, wherein the diode structure is connected to the pin; and
concurrently using the pin and the diode structure to sense a junction temperature in the IC.

10. The method of claim 9,
wherein the digital input signal is a reset signal, a clock signal, a digital control signal, or a digital data signal.

11. The method of claim 9, further comprising:
concurrently with said using the pin to provide the digital signal to the digital logic of the IC:
using the sensed junction temperature to regulate the temperature of the IC.

12. The method of claim 11, further comprising:
concurrently with said using the sensed junction temperature to regulate the temperature of the IC:
testing the IC in response to provision of the digital input signal to the digital logic of the IC.

13. The method of claim 9,
wherein said using the pin to provide the digital signal and said using the pin and the diode structure to sense the junction temperature are performed by:
high and low side current sources;
high and low side voltage sensors that sense a voltage drop across the diode structure;
an input multiplexer controlled by the digital input signal to selectively connect the high and low side current sources to the pin to concurrently provide the digital input signal to the digital logic and to drive the constant current through the diode structure; and
an output multiplexer controlled by the digital input signal to selectively connect the high and low side voltage sensors to an output that provides a sense signal indicative of the junction temperature.

14. The method of claim 9, further comprising:
providing electrical isolation between the voltage sensors and the output multiplexer to enable the voltage sensors to sense the voltage drop across the diode structure without causing or receiving interference from a system under test that includes the IC and a power supply that supplies power to the IC.

15. A method, comprising:
during first time intervals:
pulling current out of a digital function pin of an integrated circuit (IC) and measuring a temperature of the IC;
during second time intervals exclusive of the first time intervals:
pushing current into the pin and measuring the temperature of the IC;
wherein said measuring the temperature is performed by measuring a voltage on the pin; and
wherein said pushing, pulling and measuring are performed during a test of the IC.

16. The method of claim 15, further comprising:
using a digital input signal to control the direction of the current during the test; and
wherein the digital input signal is low during the first time intervals and is high during the second time intervals.

17. The method of claim 15, further comprising:
concurrently with said pulling, pushing and measuring:
using the measured junction temperature to regulate the temperature of the IC.

18. The method of claim 15,
wherein the current is pulled and pushed through an electrostatic discharge (ESD) diode structure of the IC from which the temperature is sensed, wherein the diode structure is connected to the pin.

19. The method of claim 18, further comprising:
using a digital input signal to control the direction of the current during the test; and
wherein said pulling, pushing and measuring are performed by:
high and low side current sources;
high and low side voltage sensors that sense a voltage drop across the diode structure;
an input multiplexer controlled by the digital input signal to selectively connect the high and low side current sources to the pin; and
an output multiplexer controlled by the digital input signal to selectively connect the high and low side voltage sensors.

20. The method of claim 15, further comprising:
wherein a magnitude of the pulled and pushed current is constant.

* * * * *